(12) United States Patent
Yoshimizu et al.

(10) Patent No.: US 11,195,849 B2
(45) Date of Patent: Dec. 7, 2021

(54) SEMICONDUCTOR DEVICE AND METHOD OF MANUFACTURING THE SAME

(71) Applicant: Toshiba Memory Corporation, Minato-ku (JP)

(72) Inventors: Yasuhito Yoshimizu, Yokkaichi (JP); Yuji Setta, Kuwana (JP); Masaru Kito, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/570,067

(22) Filed: Sep. 13, 2019

(65) Prior Publication Data

US 2020/0303408 A1 Sep. 24, 2020

(30) Foreign Application Priority Data

Mar. 18, 2019 (JP) .............................. JP2019-050310

(51) Int. Cl.
*H01L 27/11582* (2017.01)
*H01L 23/00* (2006.01)
(Continued)

(52) U.S. Cl.
CPC .. *H01L 27/11582* (2013.01); *H01L 21/02532* (2013.01); *H01L 21/02595* (2013.01);
(Continued)

(58) Field of Classification Search
CPC ......... H01L 27/11582; H01L 27/11573; H01L 27/1157; H01L 27/11578; H01L 24/08; H01L 24/89; H01L 24/05; H01L 29/4011;
H01L 21/02532; H01L 21/02595; H01L 21/2251; H01L 21/6835; H01L 25/50; H01L 25/18; H01L 2221/68381; H01L 2221/68345; H01L 2221/68372; H01L 2224/08147; H01L 2224/80895; H01L 2224/80896; H01L 2224/80201;
(Continued)

(56) References Cited

U.S. PATENT DOCUMENTS 8,846,508 B1 9/2014 England et al.
9,431,419 B2 8/2016 Fukuzumi et al.
(Continued)

FOREIGN PATENT DOCUMENTS

JP 2018-157069 A 10/2018

*Primary Examiner* — Kyoung Lee
*Assistant Examiner* — Christina A Sylvia
(74) *Attorney, Agent, or Firm* — Oblon, McClelland, Maier & Neustadt, L.L.P.

(57) ABSTRACT

In one embodiment, a semiconductor device includes a first film including a plurality of electrode layers and a plurality of insulating layers provided alternately in a first direction, and a first semiconductor layer provided in the first film via a charge storage layer and extending in the first direction. The device further includes a first conductive member provided in the first film and extending in the first direction, and a second semiconductor layer provided on the first film to contact the first semiconductor layer. The second semiconductor layer includes a first surface on a side of the first film, and a second surface on an opposite side of the first surface. The second surface is an uneven face protruding towards the first direction.

17 Claims, 11 Drawing Sheets

(51) Int. Cl.
*H01L 21/28* (2006.01)
*H01L 21/02* (2006.01)
*H01L 27/11573* (2017.01)
*H01L 25/00* (2006.01)
*H01L 25/18* (2006.01)
*H01L 21/225* (2006.01)
*H01L 21/683* (2006.01)

(52) U.S. Cl.
CPC .............. *H01L 24/08* (2013.01); *H01L 25/18* (2013.01); *H01L 25/50* (2013.01); *H01L 27/11573* (2013.01); *H01L 29/40117* (2019.08); *H01L 21/2251* (2013.01); *H01L 21/6835* (2013.01); *H01L 24/05* (2013.01); *H01L 24/89* (2013.01); *H01L 2221/68345* (2013.01); *H01L 2221/68372* (2013.01); *H01L 2221/68381* (2013.01); *H01L 2224/0557* (2013.01); *H01L 2224/08147* (2013.01); *H01L 2224/80006* (2013.01); *H01L 2224/80201* (2013.01); *H01L 2224/80895* (2013.01); *H01L 2224/80896* (2013.01); *H01L 2924/2011* (2013.01)

(58) Field of Classification Search
CPC ... H01L 2224/80006; H01L 2224/0557; H01L 2924/2011
See application file for complete search history.

(56) References Cited

U.S. PATENT DOCUMENTS

| | | | |
|---|---|---|---|
| 2010/0090286 A1* | 4/2010 | Lee | H01L 29/792 257/368 |
| 2012/0181602 A1* | 7/2012 | Fukuzumi | H01L 27/1207 257/326 |
| 2013/0223142 A1* | 8/2013 | Park | H01L 27/11582 365/184 |
| 2015/0235939 A1* | 8/2015 | Lee | H01L 27/11573 257/774 |
| 2016/0071873 A1 | 3/2016 | Tsuji et al. | |
| 2017/0069731 A1 | 3/2017 | Kim et al. | |
| 2017/0092654 A1 | 3/2017 | Nishikawa et al. | |
| 2018/0083102 A1 | 3/2018 | Naito et al. | |
| 2018/0261623 A1 | 9/2018 | Higashi et al. | |
| 2018/0269277 A1 | 9/2018 | Miyagawa et al. | |

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-050310, filed on Mar. 18, 2019, the entire contents of which are incorporated herein by reference.

FIELD

Embodiments disclosed herein relate to a semiconductor device and a method of manufacturing the same.

BACKGROUND

It is desired for a three-dimensional memory to propose a method of electrically connecting a channel semiconductor layer with an interconnection such as a source interconnection layer in a preferable manner.

DETAILED DESCRIPTION

In one embodiment, a semiconductor device includes a first film including a plurality of electrode layers and a plurality of insulating layers provided alternately in a first direction, and a first semiconductor layer provided in the first film via a charge storage layer and extending in the first direction. The device further includes a first conductive member provided in the first film and extending in the first direction, and a second semiconductor layer provided on the first film to contact the first semiconductor layer. The second semiconductor layer includes a first surface on a side of the first film, and a second surface on an opposite side of the first surface. The second surface is an uneven face protruding towards the first direction.

Embodiments will now be explained with reference to the accompanying drawings. The same reference signs are applied to the same or similar components in FIGS. 1 to 9, and duplicated explanations are to be omitted.

First Embodiment

Figure 1:
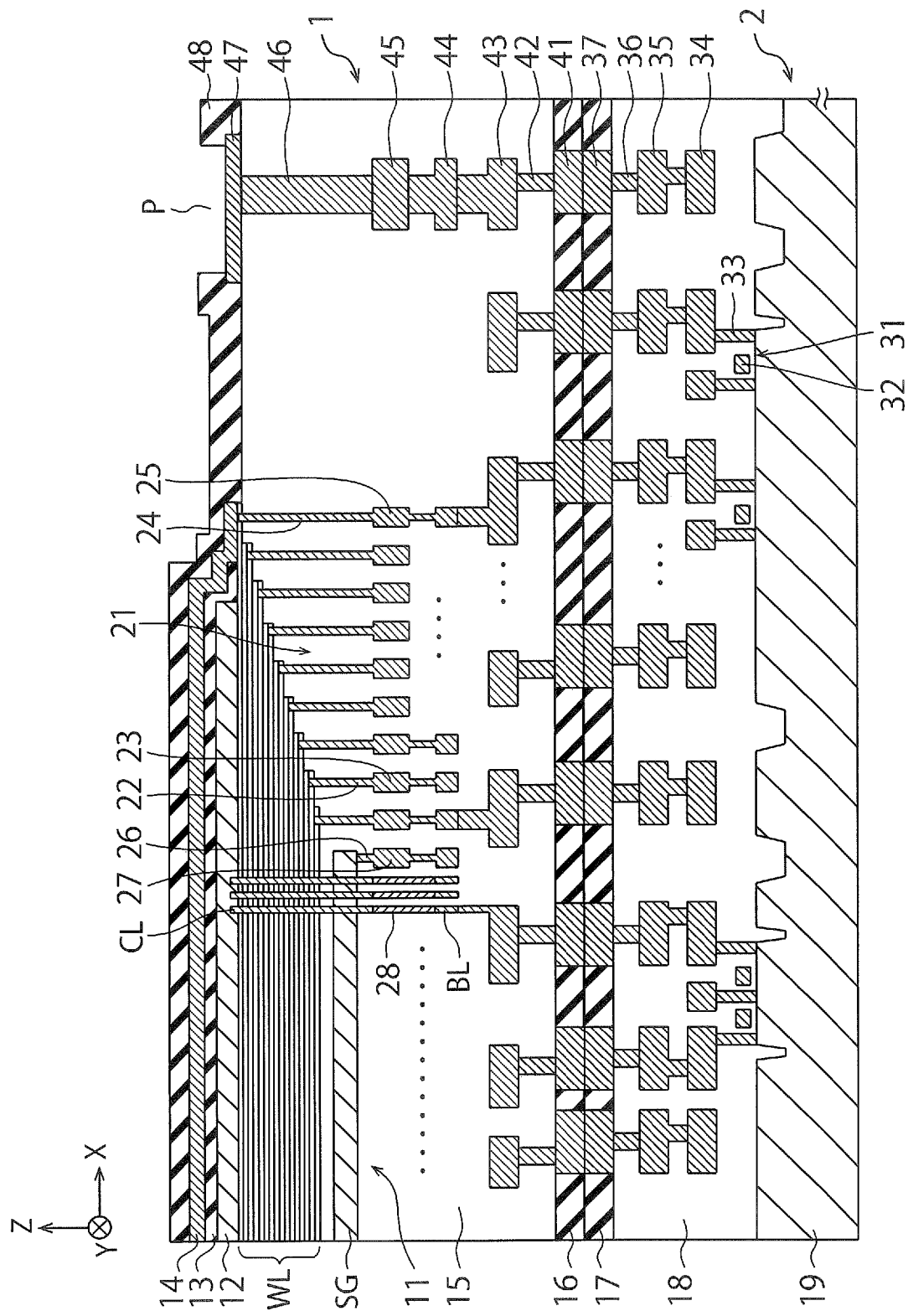
FIG. 1 is a cross-sectional view illustrating a structure of a semiconductor device of a first embodiment.

FIG. 1 is a cross-sectional view illustrating a structure of a semiconductor device of the first embodiment. The semiconductor device of FIG. 1 is a three-dimensional memory in which an array chip 1 and a circuit chip 2 are bonded. The circuit chip 2 is an example of a first chip. The array chip 1 is an example of a second chip.

The array chip 1 includes a memory cell array 11 including a plurality of memory cells, a semiconductor layer 12 on the memory cell array 11, a back-gate insulator 13 on the semiconductor layer 12, and a back-gate electrode 14 on the back-gate insulator 13. The back-gate electrode 14 is used for controlling electric fields of the semiconductor layer 12 like a selection gate SG to be descried later. Details of the semiconductor layer 12, the back-gate insulator 13, and the back-gate electrode 14 will be described later. The array chip 1 further includes an inter layer dielectric 15 under the memory cell array 11 and an insulator 16 under the inter layer dielectric 15. The insulator 16 is a silicon oxide film, for example.

The circuit chip 2 is provided under the array chip 1. The circuit chip 2 includes an insulator 17 under the insulator 16, an inter layer dielectric 18 under the insulator 17, and a substrate 19 under the inter layer dielectric 18. The insulator 17 is a silicon oxide film, for example. The substrate 19 is a semiconductor substrate such as a silicon substrate, for example.

FIG. 1 illustrates an X direction and a Y direction which are perpendicular to each other and in parallel to surfaces of the substrate 19, and a Z direction that is perpendicular to the surfaces of the substrate 19. In this specification, a +Z direction is treated as an upper direction, and a –Z direction is treated as a lower direction. The –Z direction may or may not be consistent with a gravity direction. Note that the +Z direction and the –Z direction are examples of a first direction.

The array chip 1 includes a plurality of word lines WL and a selection gate SG as an electrode layer in the memory cell array 11. FIG. 1 illustrates a step-like structure portion 21 of the memory cell array 11. The array chip 1 further includes the above-described back-gate electrode 14 as an electrode layer outside the memory cell array 11. As illustrated in FIG. 1, each of the word lines WL is electrically connected to a word interconnection layer 23 via a contact plug 22, the back-gate electrode 14 is electrically connected to a back-gate interconnection layer 25 via a contact plug 24, and the selection gate SG is electrically connected to a selection gate interconnection layer 27 via a contact plug 26. A columnar portion CL piercing through the word lines WL and the selection gate SG is electrically connected to a bit line BL via a plug 28 and electrically connected to the semiconductor layer 12 as well. Details of the word lines WL, the columnar portion CL, and the like will be described later.

The circuit chip 2 includes a plurality of transistors 31. Each of the transistors 31 includes a gate electrode 32 provided on the substrate 19 via a gate insulator, and a source diffusion layer as well as a drain diffusion layer, not shown, provided in the substrate 19. The circuit chip 2 further includes a plurality of plugs 33 provided on the source diffusion layer or the drain diffusion layer of those transistors 31, an interconnection layer 34 including a plurality of interconnections provided on those plugs 33, and an interconnection layer 35 including a plurality of interconnections provided on the interconnection layer 34. The circuit chip 2 further includes a plurality of via-plugs 36 provided on the interconnection layer 35, and a plurality of metal pads 37 provided on the via-plugs 36 in the insulator 17. The circuit chip 2 functions as a control circuit (logic circuit) that controls the array chip 1. The metal pad 37 is an example of a first pad.

The array chip 1 includes a plurality of metal pads 41 provided on the metal pads 37 in the insulator 16, a plurality of via-plugs 42 provided on the metal pads 41, and an interconnection layer 43 including a plurality of interconnections provided on those via-plugs 42. Each of the word lines WL and each of the bit lines BL are electrically connected to the corresponding lines in the interconnection layer 43. The array chip 1 further includes an interconnection layer 44 including a plurality of interconnections provided on the interconnection layer 43, an interconnection layer 45 including a plurality of interconnections provided on the interconnection layer 44, and a via-plug 46 provided on the interconnection layer 45. The array chip 1 further includes a metal pad 47 provided on the via-plug 46, and a passivation film 48 that covers the metal pad 47 and the back-gate electrode 14. The passivation film 48 is a silicon oxide film, for example, and includes an opening portion P for exposing the top face of the metal pad 47. The metal pad 47 is an external connection pad of the semiconductor device illustrated in FIG. 1, and can be connected to a mounting board or another device via solder balls, metal bumps, wire bonding, or the like. The metal pad 41 is an example of a second pad.

Figure 2:
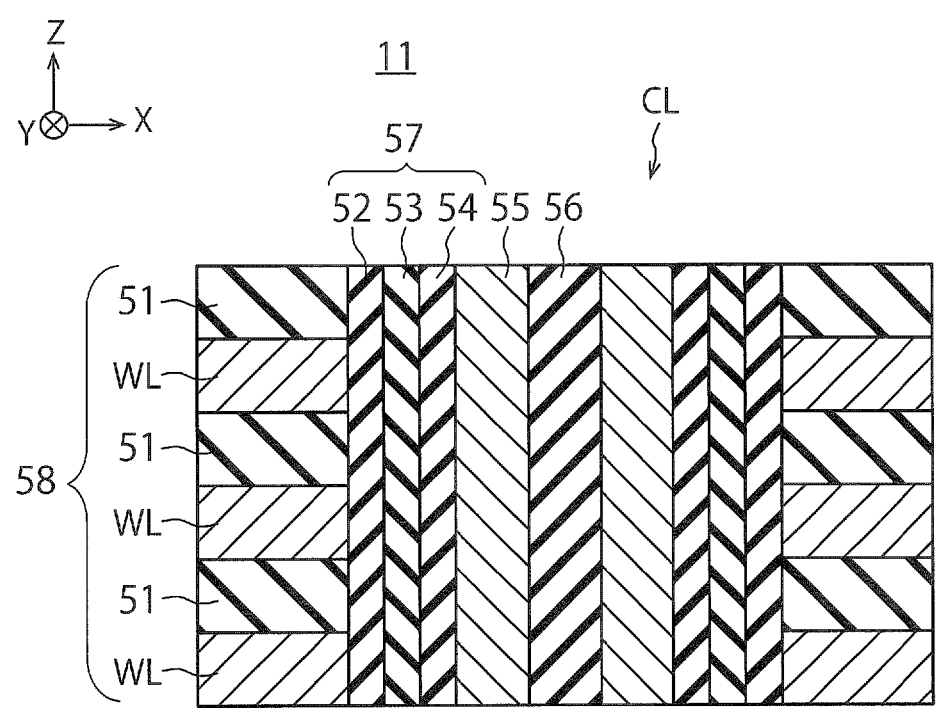
FIG. 2 is a cross-sectional view illustrating a structure of a columnar portion of the first embodiment.

FIG. 2 is a cross-sectional view illustrating a structure of the columnar portion CL of the first embodiment.

As illustrated in FIG. 2, the memory cell array 11 includes a stacked film 58 formed on the inter layer dielectric 15 (FIG. 1), and the stacked film 58 includes the plurality of word lines WL and a plurality of insulating layers 51 provided alternately in the Z direction. The word lines WL are W (tungsten) layers, for example. The insulating layers 51 are silicon oxide films, for example. The stacked film 58 is an example of a first film, and the word lines WL are an example of an electrode layer.

The columnar portion CL includes a memory insulator 57, a channel semiconductor layer 55, and a core insulator 56 entending in the Z direction. The memory insulator 57 includes a block insulator 52, a charge storage layer 53, and a tunnel insulator 54. The charge storage layer 53 is a silicon nitride film, for example, and formed on a side face of the stacked film 58 via the block insulator 52. The channel semiconductor layer 55 is a polysilicon layer, for example, and formed on a side face of the charge storage layer 53 via the tunnel insulator 54. The block insulator 52, the tunnel insulator 54, and the core insulator 56 are silicon oxide films or metal insulators, for example. The channel semiconductor layer 55 is an example of a first semiconductor layer. The charge storage layer 53 may be a layer other than the insulator as long as it is capable of storing the electric charges.

Figure 3:
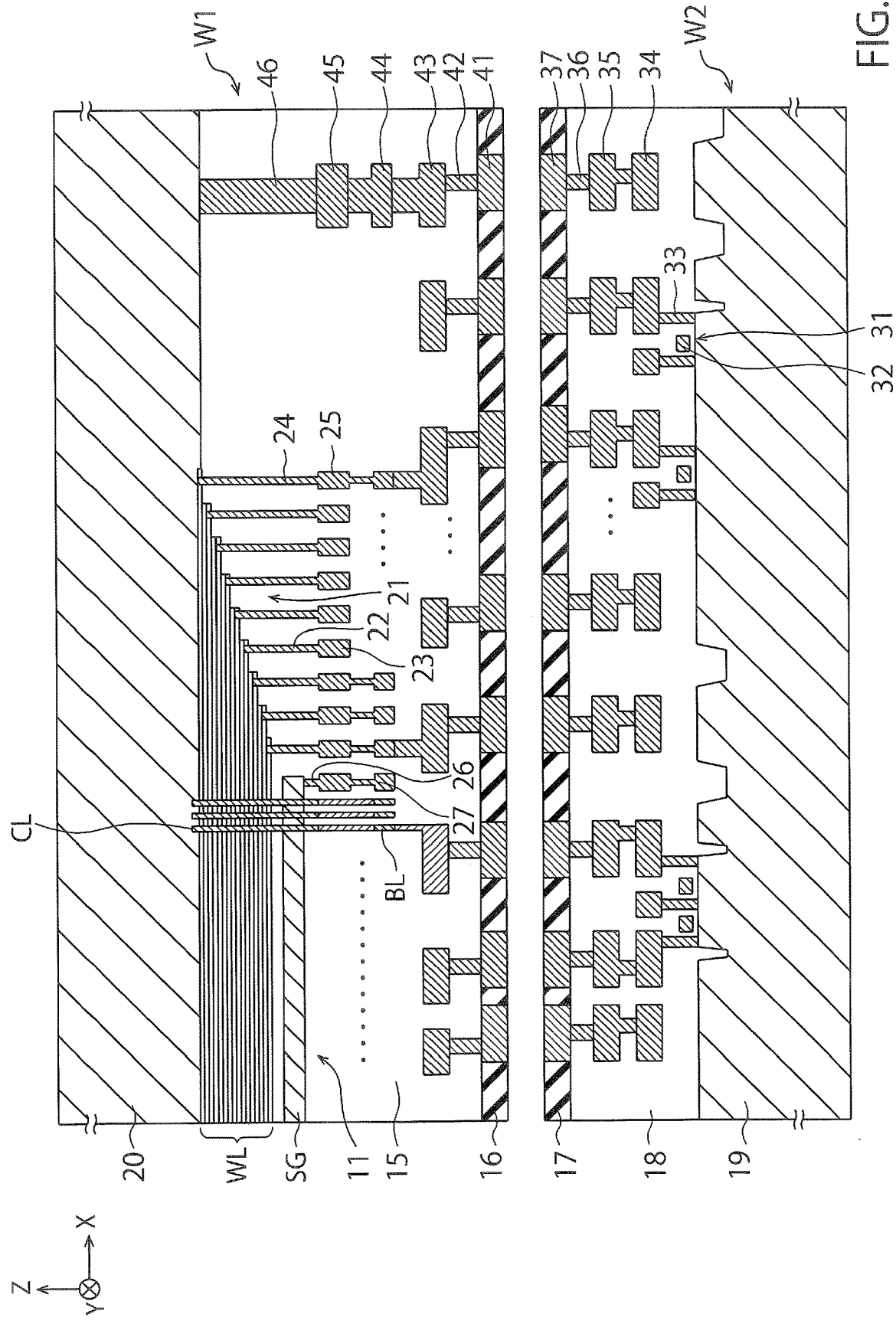
FIG. 3 is a cross-sectional view illustrating a method of manufacturing the semiconductor device of the first embodiment.

FIG. 3 is a cross-sectional view illustrating a method of manufacturing the semiconductor device of the first embodiment.

FIG. 3 illustrates an array wafer W1 including a plurality of array chips 1 and a circuit wafer W2 including a plurality of circuit chips 2. The array wafer W1 does not include the semiconductor layer 12, the back-gate insulator 13, and the back-gate electrode 14 but includes a substrate 20 on the memory cell array 11.

First, the array wafer W1 and the circuit wafer W2 are bonded by applying mechanical pressure. Thereby, the insulator 16 and the insulator 17 are bonded. Next, the array wafer W1 and the circuit wafer W2 are annealed at 400° C. Thereby, the metal pads 41 and the metal pads 37 are joined.

Thereafter, the substrate 20 is removed by CMP (Chemical Mechanical Polishing) or wet etching, and the substrate 19 is thinned by CMP or wet etching. Then the array wafer W1 and the circuit wafer W2 are cut into a plurality of chips. In the manner described above, the semiconductor device of FIG. 1 is manufactured. The semiconductor layer 12, the back-gate insulator 13, the back-gate electrode 14, the metal pads 47, and the passivation film 48 are formed on the memory cell array 11 or on the via-plug 46 after removing the substrate 20, for example.

While the array wafer W1 and the circuit wafer W2 are bonded in the present embodiment, the array wafers W1 may be bonded to each other instead. Contents described by referring to FIG. 1 to FIG. 3 and contents to be described later by referring to FIG. 4 to FIG. 9 can also be applied for bonding the array wafers W1 with each other.

Further, while FIG. 1 illustrates a boundary face between the insulator 16 and the insulator 17 and boundary faces between the metal pads 41 and the metal pads 37, those boundary faces normally become unobservable after the annealing described above. However, it is possible to estimate the positions of those boundary faces through detecting tilt of the side faces of the metal pads 41 and the metal pads 37 or detecting position shift between the side faces of the metal pads 41 and the metal pads 37, for example.

While the insulator 16 is formed on the bottom face of the inter layer dielectric 15 in FIGS. 1 and 3, the insulator 16 may be included and integrated with the inter layer dielectric 15. Similarly, while the insulator 17 is formed on the top face of the inter layer dielectric 18 in FIGS. 1 and 3, the insulator 17 may be included and integrated with the inter layer dielectric 18.

Figure 4:
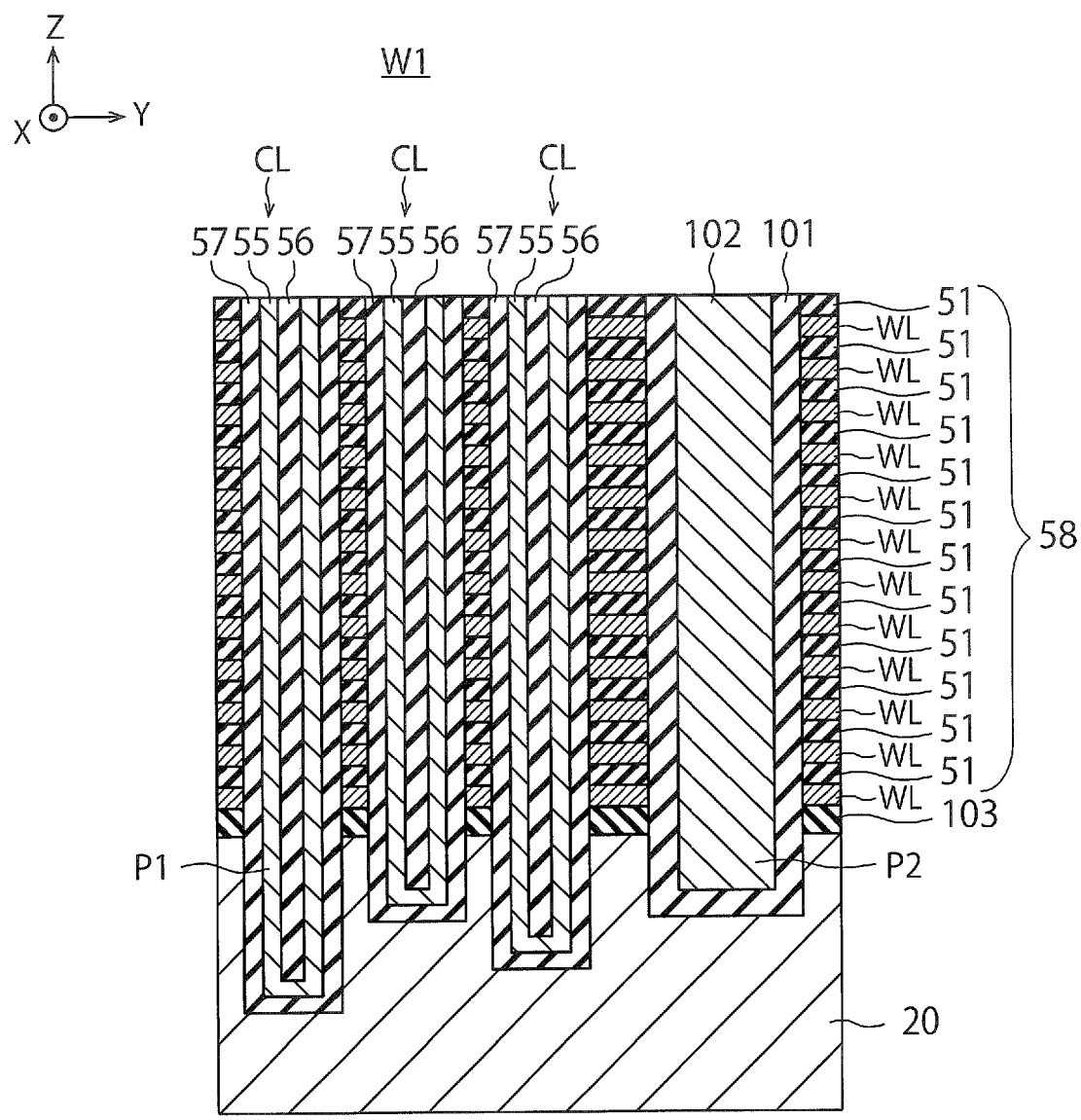
FIGS. 4 to 6 are cross-sectional views illustrating details of the method of manufacturing the semiconductor device of the first embodiment.
Figure 5:
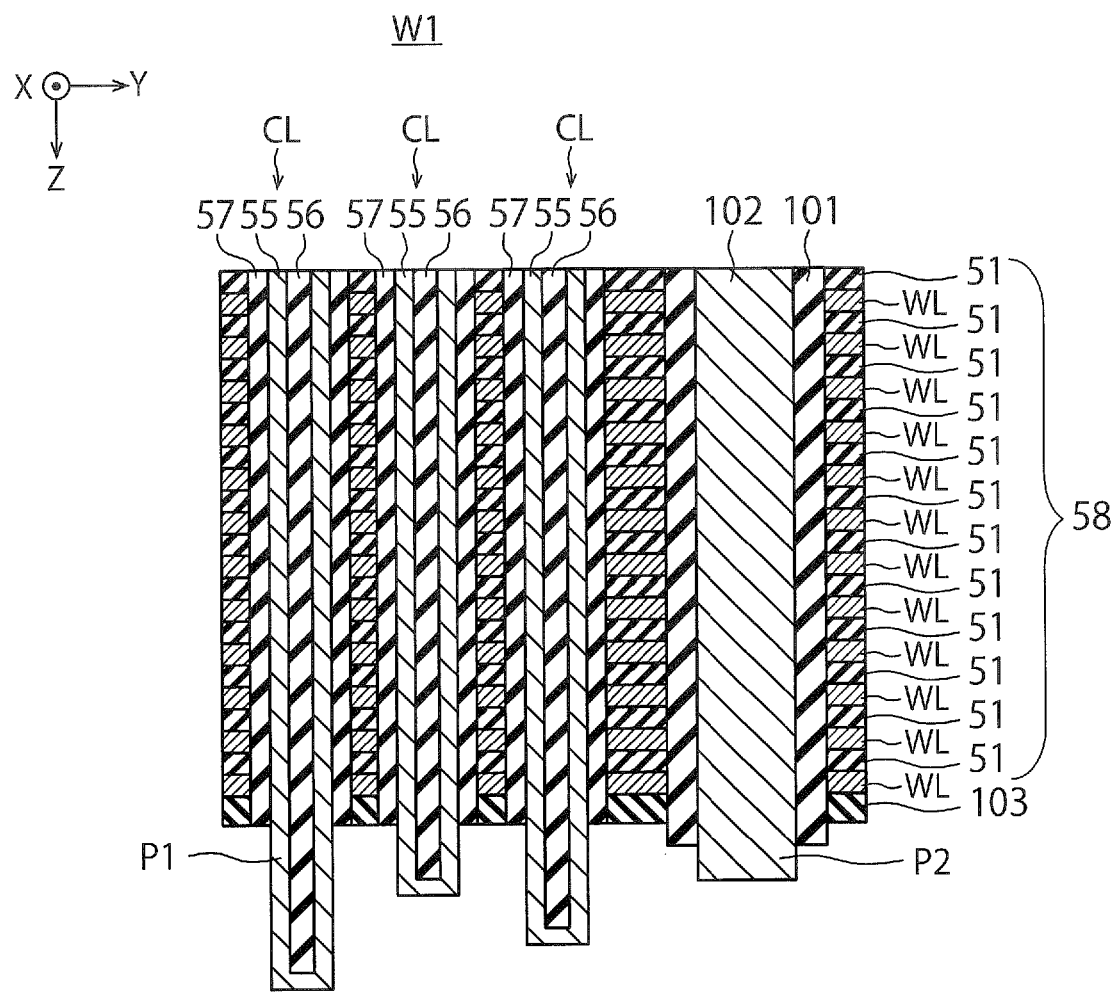
Figure 6:
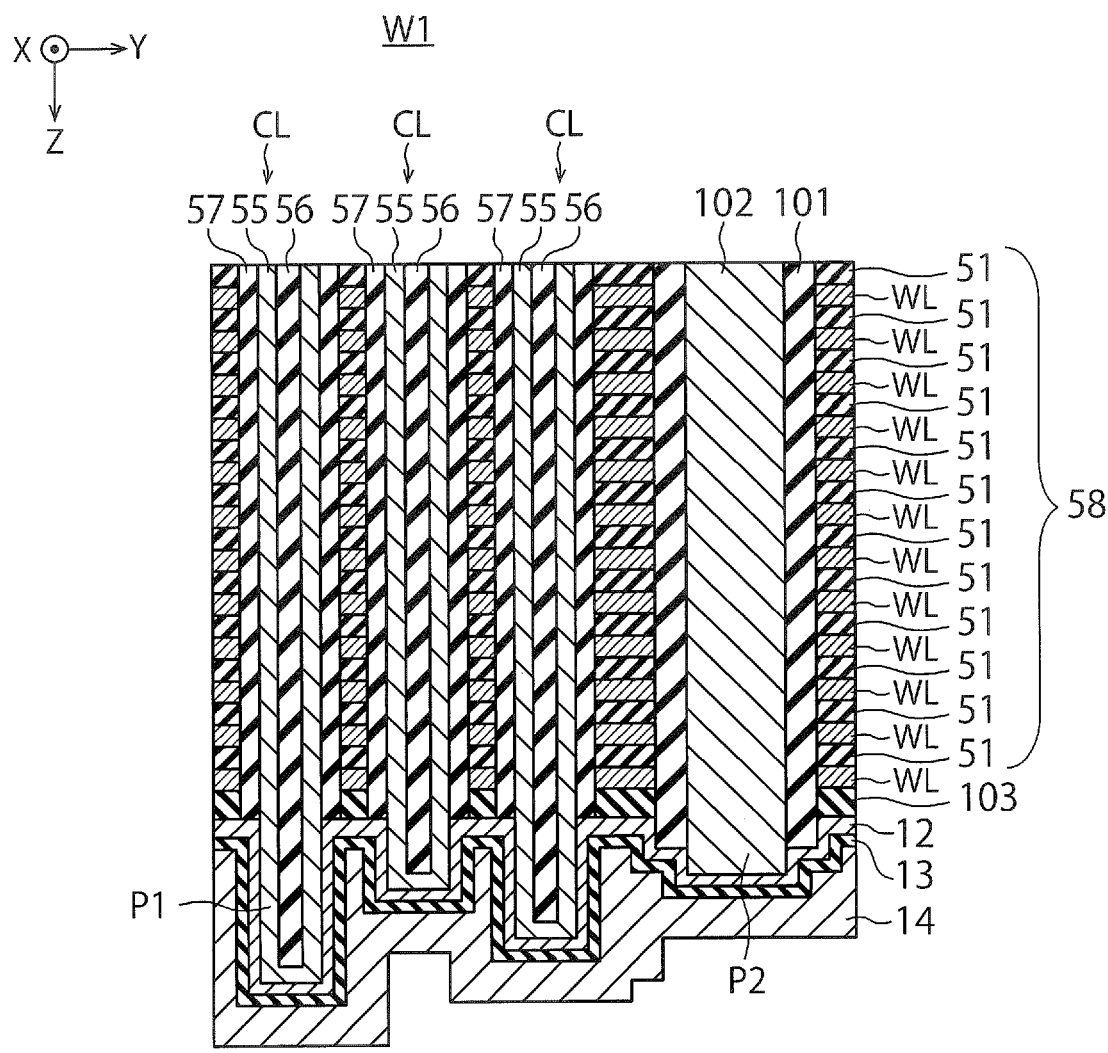

FIGS. 4 to 6 are cross-sectional views illustrating details of the method of manufacturing the semiconductor device of the first embodiment.

As in the case of FIG. 3, FIG. 4 illustrates the array wafer W1 before being bonded to the circuit wafer W2. Note, however, that the array wafer W1 of FIG. 3 is in a state where the upper portion and the lower portion are inverted from those of the array wafer W1 of FIG. 4 for bonding. That is, FIG. 4 illustrates the array wafer W1 before being inverted, and FIG. 3 illustrates the array wafer W1 after being inverted.

In the present embodiment, an etch stopper insulator 103 is formed on the substrate 20, and the stacked film 58 is formed on the etch stopper insulator 103 (FIG. 4). The etch stopper insulator 103 is a high-k insulator (high dielectric insulator), for example. The high-k insulator is an insulator containing a rare-earth element, for example. The stacked film 58 is formed to include the word lines WL and the insulating layers 51 alternately.

Next, a plurality of holes and a slit piercing through the stacked film 58 and the etch stopper insulator 103 are formed by etching, the memory insulator 57, the channel semiconductor layer 55, and the core insulator 56 are formed in order in those holes, and a source insulator 101 and a source interconnection layer 102 are formed in order in the slit (FIG. 4). As a result, a plurality of columnar portions CL and the source interconnection layer 102 entending in the Z direction are formed in the stacked film 58 and the etch stopper insulator 103. The source insulator 101 is a silicon oxide film, for example, and the source interconnection layer 102 is a polysilicon layer or a metal layer, for example. The source interconnection layer 102 is an example of a first conductive member.

When over-etching of the substrate 20 occurs at the time of forming the holes and the slit described above, the holes and the slit are projected from the stacked film 58 (and the etch stopper insulator 103) into the substrate 20. FIG. 4 illustrates an example of a case with such over-etching. Therefore, each of the channel semiconductor layers 55 includes a projected portion P1 that is projected from the stacked film 58 into the substrate 20, and the source interconnection layer 102 includes a projected portion P2 that is projected from the stacked film 58 into the substrate 20. The projected portion P1 is an example of a first portion, and the projected portion P2 is an example of a second portion. The over-etching amount of the substrate 20 varies for each of the holes and slit, so that there is a difference in the height (length in the Z direction) of the projected portions P1 and P2 with respect to each other.

When forming the stacked film 58, a replacement step may be employed. In such case, a plurality of sacrificial layers and the insulating layers 51 are alternately formed on the etch stopper insulator 103, and the columnar portions CL and the source interconnection layer 102 are formed in the sacrificial layers, the insulating layers 51, and the etch stopper insulator 103. Thereafter, a plurality of cavities are formed between the insulating layers 51 by removing the sacrificial layers, and the word lines WL are embedded into the cavities. Thereby, the stacked film 58 including the plurality of word lines WL and the insulating layers 51 alternately is formed, and the columnar portions CL and the source interconnection layer 102 are formed in the stacked film 58.

Then, after bonding the array wafer W1 to the circuit wafer W2 (see FIG. 3), steps of FIGS. 5 and 6 are performed. When performing the steps of FIGS. 5 and 6, the array wafer W1 is actually held such that the bottom portions of the columnar portions CL are located on the upper side. However, in FIGS. 5 and 6, the bottom portions of the columnar portions CL are illustrated to be located on the lower side for making it easy to be compared with FIG. 4. Therefore, it is to be noted that the bottom portions of the columnar portions CL are actually located not on the lower side but on the upper side and that the etch stopper insulator 103 is actually located not on the bottom face of the stacked film 58 but on the top face thereof when performing the steps of FIGS. 5 and 6. Because of such reason, it is also to be noted that arrows indicating the Z direction in FIGS. 5 and 6 are illustrated pointing downward on the paper face unlike that of FIG. 4.

In FIG. 5, the substrate 20 is removed by wet etching or dry etching by using the etch stopper insulator 103 as a stopper. Wet etching is performed by using a hydrofluoric acid solution or an alkaline solution, for example. Dry etching is performed by using gas containing fluorine or chlorine, for example. A fluorine acid solution, phosphoric acid, or gas containing fluorine or chlorine is also used when performing etching of the memory insulator 57 later. Therefore, the etch stopper insulator 103 is preferable to be formed with a material that is not etched or hard to be etched by such liquids and gas. Further, the etch stopper insulator 103 of the present embodiment is also used for implementing a function of performing gate-control of carrier concentration of the semiconductor layer 12 to be formed later. Therefore, it is desirable for the etch stopper insulator 103 of the present embodiment to be a high-k insulator such as a ZrO film or an HfO film (Zr indicates zirconium, and Hf indicates hafnium). Etching of FIG. 5 is continued until the memory insulator 57 and the source insulator 101 covering the projected portions P1 and P2 are removed. As a result, the surfaces of the projected portions P1 and P2 are exposed.

Then, the semiconductor layer 12 is formed on the surfaces of the etch stopper insulator 103, the projected portions P1 of the channel semiconductor layers 55, and the projected portion P2 of the source interconnection layer 102 (FIG. 6). As a result, the semiconductor layer 12 is formed on the surface of the stacked film 58 via the etch stopper insulator 103. The semiconductor layer 12 is formed to be in contact with the projected portions P1 and P2, thereby electrically connected to the channel semiconductor layers 55 and the source interconnection layer 102. The semiconductor layer 12 is an example of a second semiconductor layer. The semiconductor layer 12 is a p-type polysilicon layer, for example, and has thickness of 10 nm or less. The semiconductor layer 12 may also be an n-type polysilicon layer.

Then, the back-gate insulator 13 is formed on the surface of the semiconductor layer 12, and the back-gate electrode 14 is formed on the surface of the back-gate insulator 13 (FIG. 6). As a result, the etch stopper insulator 103, the semiconductor layer 12, the back-gate insulator 13, and the back-gate electrode 14 are stacked in order on the stacked film 58. The back-gate insulator 13 is an example of a first insulator, and the back-gate electrode 14 is an example of a first electrode. The back-gate insulator 13 is a silicon oxide film, for example. The back-gate electrode 14 is a metal layer, for example.

As described, in the steps of FIGS. 5 and 6, the substrate 20 is removed, and the semiconductor layer 12, the back-gate insulator 13, and the back-gate electrode 14 are formed. As a result, implemented is a structure in which the projected portions P1 and P2 are projected from the stacked film 58 into the semiconductor layer 12, the back-gate insulator 13, and the back-gate electrode 14. Thereafter, the array wafer W1 and the circuit wafer W2 are cut into a plurality of chips to form the semiconductor device of FIG. 1. As in the case of FIG. 1, FIG. 6 illustrates the structure of the semiconductor device of the first embodiment.

Hereinafter, more details of the semiconductor device of the present embodiment will be described by referring to FIG. 6.

When forming a columnar portion including a memory insulator, a channel semiconductor layer, and a core insulator in order on a substrate in a case of a typical three-dimensional memory, an opening portion may be formed in the bottom portion of the memory insulator and a channel body layer may be embedded in the opening portion. Thereby, the channel semiconductor layer is electrically connected to the substrate via the channel body layer. Further, a source interconnection layer is electrically connected to the substrate as well. As a result, the channel semiconductor layer and the source interconnection layer are electrically connected to each other. However, when depth of a plurality of holes in which a plurality of columnar portions are to be embedded varies, the three-dimensional memory may not operate properly. The reason thereof is that carrier electrons become hard to reach the channel semiconductor layer whose channel body layer is at a deep position among the channel semiconductor layers of those columnar portions.

Therefore, in the present embodiment, the substrate 20 is removed and, further, the memory insulator 57 covering the projected portions P1 and P2 is removed to expose the surfaces of the projected portions P1 and P2 (FIG. 5). Then, the semiconductor layer 12 is formed on the exposed surfaces of the projected portions P1 and P2 (FIG. 6). Thereby, the channel semiconductor layer 55 and the source interconnection layer 102 of each of the columnar portions (memory strings) CL are electrically connected to each other via the semiconductor layer 12. The semiconductor layer 12 of the present embodiment is a silicon thin film having a thickness of 10 nm or less.

The semiconductor layer 12 is covered by the back-gate insulator 13 and the back-gate electrode 14, and those form a MOS (Metal-Oxide-Semiconductor) structure. Similarly, the semiconductor layer 12, the etch stopper insulator 103, and the word line WL located at a position closest to the etch stopper insulator 103 form another MOS structure. In the present embodiment, a carrier path is formed in the channel semiconductor layer 55 and in the semiconductor layer 12 by the back-gate electrode 14 and the word line WL to be connected to the source interconnection layer 102. This makes it possible to implement preferable operations of the three-dimensional memory. While the word line WL located at the position closest to the etch stopper insulator 103 functions precisely not as the word line WL but as a selection line, it is expressed as "word line WL" for convenience because it is formed with the same material as that of the other word lines WL.

In such case, the thickness of the semiconductor layer 12 is preferable to be 10 nm or less as described above. This is because for securing a space for allowing the back-gate electrode 14 to enter between the projected portions P1 and because the thickness of an inversion layer generated in the semiconductor layer 12 is several nm. When the semiconductor layer 12 is thick, the charge storage layer and the inversion layer are cut off in the Z direction. Therefore, there is a possibility of decreasing cell currents.

Further, the reason why the semiconductor layer 12 is desirable to be a p-type diffusion layer is for supplying holes to the channel semiconductor layer 55 when erasing data in the memory cell. When the semiconductor layer 12 is formed as an n-type diffusion layer, an action of GIDL (Gate Induced Drain Leakage) erasure for generating holes at a gate edge of the selection gate SG is required.

It is preferable for the channel semiconductor layer 55 to contain impurity atoms. For example, through providing a p-type high-concentration diffusion layer on the bottom portion (the projected portion P1, for example) in the channel semiconductor layer 55, it is possible to prevent the "cut-off" mentioned above.

It is also preferable for the semiconductor layer 12 to contain impurity atoms. Therefore, the semiconductor layer 12 also contains p-type impurities. This makes it possible to more efficiently prevent the "cut-off" mentioned above.

In the present embodiment, there is a case where the interconnection layers 34, 35, 43 44, 45 and the metal pads 37, 41, and 47 are formed as Cu (copper) layers. In such case, it may be difficult to perform heat treatment with the channel semiconductor layer 55 and the semiconductor layer 12 formed as the p-type diffusion layers in order to avoid influences of the heat to the Cu layers. In such case, heat treatment can be performed while avoiding the influence of the heat to the Cu layers through performing the heat treatment of the p-type diffusion layers by laser heating or microwave heating. This makes it possible to form a polysilicon layer of good quality as the p-type diffusion layers. Examples of such heat treatment are heat treatment for diffusing the p-type impurities (for example, a group III element such as boron, aluminum, or indium) in the semiconductor layer and heat treatment for crystallizing the semiconductor layer formed with amorphous at a low temperature. The heat treatment may also be heat treatment of extremely short time, such as lamp heating.

Next, referring back to FIG. 1, the contact plug (gate line, gate contact plug) 24 between the back-gate electrode 14 and the back-gate interconnection layer 25 will be described.

The gate line 24 is formed in the inter layer dielectric 15, and located outside the stacked film 58 of the memory cell array 11 (FIG. 2). The gate line 24 is a polysilicon layer or a metal layer, for example. The gate line 24 extends in the Z direction, and comes in contact with the back-gate electrode 14 by piercing through the etch stopper insulator 103 (FIG. 4). The gate line 24 is an example of a second conductive member. The gate line 24 of the present embodiment is formed in the step of FIG. 4 like the columnar portions CL and the source interconnection layer 102.

As described above, in the present embodiment, the steps of FIGS. 5 and 6 are performed after bonding the array wafer W1 to the circuit wafer W2. In the step of FIG. 5, the substrate 20 is removed, and the memory insulator 57 and the source insulator 101 covering the projected portions P1 and P2 are removed. In the step of FIG. 6, the semiconductor layer 12 is formed on the surfaces of the etch stopper insulator 103 and the projected portions P1, P2, the back-gate insulator 13 is formed on the surface of the semiconductor layer 12, and the back-gate electrode 14 is formed on the surface of the back-gate insulator 13.

At that time, the semiconductor layer 12 and the back-gate insulator 13 are formed so as not to cover the gate line 24. Alternatively, after forming the semiconductor layer 12 and/or the back-gate insulator 13 on the surface of the gate line 24, the semiconductor layer 12 and/or the back-gate insulator 13 are removed from the surface of the gate line 24 before forming the back-gate electrode 14. As a result, the back-gate electrode 14 is formed on the surface of the gate line 24 to be in contact with the gate line 24. This makes it possible to electrically connect the back-gate electrode 14 to the gate line 24 while enabling the back-gate electrode 14 to function as a portion of the MOS structure.

In the present embodiment, through bonding the array wafer W1 to the circuit wafer W2, the gate line 24 in the array wafer W1 is electrically connected to a logic circuit (CMOS circuit) in the circuit wafer W2. Therefore, in the step of FIG. 6, the back-gate electrode 14 is electrically connected to the circuit wafer W2 via the gate line 24. The back-gate electrode 14 of the present embodiment may be formed by a same metal layer as that of the metal pad 48 of FIG. 1.

As described above, the semiconductor device of the present embodiment includes the semiconductor layer 12 provided on the bottom face side of the stacked film 58 to be in contact with the channel semiconductor layer 55 and the source interconnection layer 102. Therefore, it is possible with the present embodiment to electrically connect the channel semiconductor layer 55 and the source interconnection layer 102 in a preferable manner.

For example, with the present embodiment, it is possible to electrically connect the plurality of channel semiconductor layers 55 with the projected portions P1 of different depths to the source interconnection layer 102 via the same semiconductor layer 12 through forming an electronic layer in the semiconductor layer 12 by controlling electric fields of double gates of the selection gate SG and the back-gate electrode 14.

Further, when the opening portion is formed on the bottom portion of the memory insulator and the channel body layer is embedded into the opening portion, there is a possibility of having opening failure in the opening portion.

In the meantime, with the present embodiment, it is possible to avoid having such opening failure through removing the memory insulator 57 that covers the projected portions P1. Furthermore, while it becomes difficult to form the opening portion on the bottom portion of the memory insulator when the stacked film becomes thick, the memory insulator 57 that covers the projected portions P1 is easily removed even when the stacked film 58 becomes thick. Therefore, there is an advantage in the structure of the present embodiment that it is easily implemented even when the stacked film 58 becomes thick.

Second Embodiment

Figure 7:
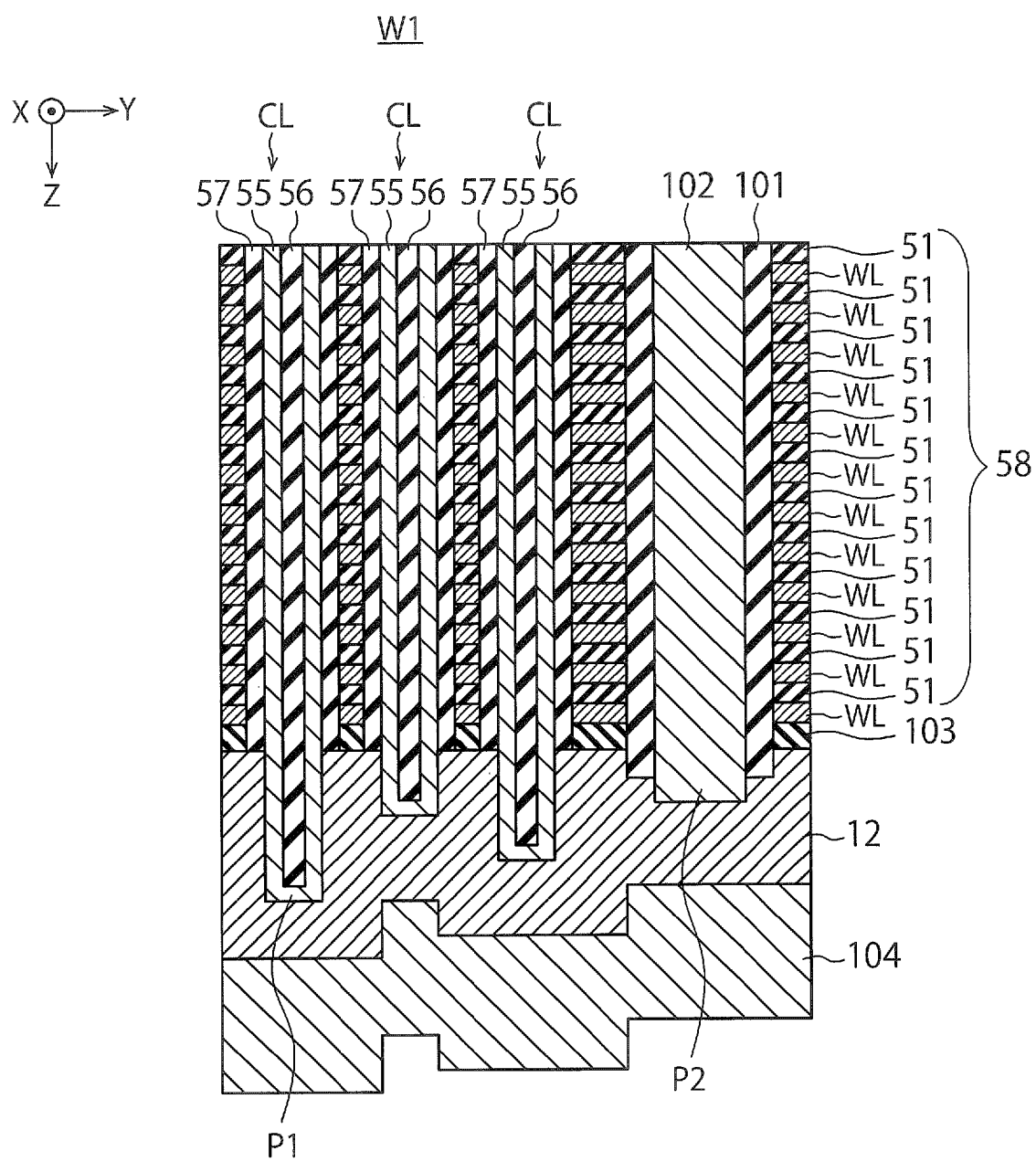
FIG. 7 is a cross-sectional view illustrating a structure of a semiconductor device of a second embodiment.

FIG. 7 is a cross-sectional view illustrating a structure of a semiconductor device of a second embodiment.

FIG. 7 of the present embodiment corresponds to FIG. 6 of the first embodiment. In the present embodiment, however, the back-gate insulator 13 and the back-gate electrode 14 are not formed on the surface of the semiconductor layer 12. Also, while the semiconductor layer 12 of the first embodiment is formed thin, the semiconductor layer 12 of the present embodiment is formed thick. Further, in the present embodiment, a metal layer 104 is formed on the surface of the semiconductor layer 12. The metal layer 104 is a low-resistant layer such as an aluminum layer, for example.

The semiconductor layer 12 includes a first surface on the channel semiconductor layers 55 and the source interconnection layer 102 side, and a second surface on an opposite side of the channel semiconductor layers 55 and the source interconnection layer 102. In FIG. 7, the first surface is the surface of the semiconductor layer 12 in the −Z direction, and the second surface is the surface of the semiconductor layer 12 in the +Z direction.

The first surface and the second surface of the present embodiment have unevenness due to the influence of the projected portions P1 and P2 as in the case of the first embodiment. Specifically, the first surface and the second surface of the present embodiment are uneven faces having unevenness over regions in the +Z direction of the semiconductor layers 55 and a region in the +Z direction of the source interconnection layer 102. However, the thickness of the semiconductor layer 12 in those regions is about uniform. The contents described above also apply to the metal layer 104, and also apply to a case where another layer instead of the metal layer 104 is formed on the surface of the semiconductor layer 12 (the back-gate insulator 13 and the back-gate electrode 14 of the first embodiment, for example).

It is considered that unevenness on the second surface is eased as the semiconductor layer 12 becomes thicker. That is, as the semiconductor layer 12 becomes thicker, the shape of the second surface becomes closer to a flat shape. When unevenness of the second surface of the semiconductor layer 12 is eased, unevenness on both surfaces of the metal layer 104 is to be eased as well.

The structure of the present embodiment can be employed to a case where the three-dimensional memory can properly be operated without the back-gate electrode 14, for example. For example, when the channel semiconductor layers 55 and the semiconductor layer 12 are both formed as the n-type diffusion layers, the structure of the present embodiment is employed. Further, with the present embodiment, long-distance transport of electric currents can be done easily through forming the metal layer 104 on the surface of the semiconductor layer 12.

Third Embodiment

Figure 8:
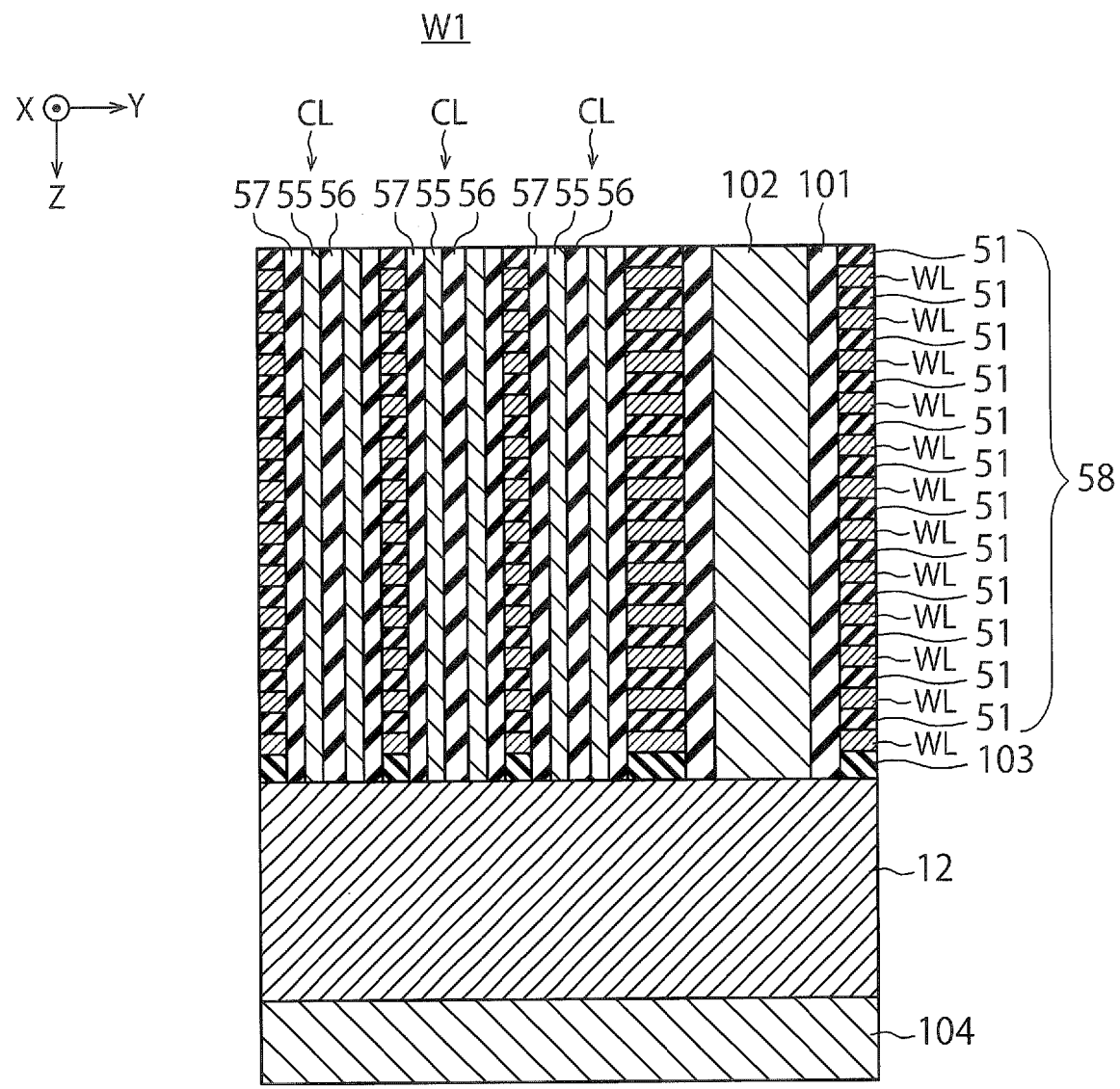
FIG. 8 is a cross-sectional view illustrating a structure of a semiconductor device of a third embodiment.

FIG. 8 is a cross-sectional view illustrating a structure of a semiconductor device of a third embodiment.

FIG. 8 of the present embodiment corresponds to FIG. 7 of the second embodiment. However, the channel semiconductor layers 55 and the source interconnection layer 102 of the present embodiment are not projected from the stacked film 58 into the semiconductor layer 12. That is, there is no projected portion P1 or P2. Such a structure can be implemented by continuing CMP or wet etching until the projected portions P1 and P2 are completely taken off when removing the substrate 20.

The semiconductor layer 12 includes a first surface on the channel semiconductor layers 55 and the source interconnection layer 102 side, and a second surface on the opposite side of the channel semiconductor layers 55 and the source interconnection layer 102. In FIG. 8, the first surface is the surface of the semiconductor layer 12 in the −Z direction, and the second surface is the surface of the semiconductor layer 12 in the +Z direction.

The first surface and the second surface of the present embodiment have no unevenness because there is no influence of the projected portions P1 and P2. Specifically, the first surface and the second surface of the present embodiment are flat faces that are flat over regions in the +Z direction of the semiconductor layers 55 and a region in the +Z direction of the source interconnection layer 102. The thickness of the semiconductor layer 12 in those regions is about uniform. The contents described above also apply to the metal layer 104, and also apply to a case where another layer instead of the metal layer 104 is formed on the surface of the semiconductor layer 12.

With the present embodiment, it is possible to reduce variation in the cell currents of the columnar portions CL through removing the projected portions P1 and P2. In the meantime, with the second embodiment, the "cut-off" mentioned above can be more efficiently reduced through widening a contact area between the channel semiconductor layers 55 and the semiconductor layer 12 and a contact area between the source interconnection layer 102 and the semiconductor layer 12.

The semiconductor device of the present embodiment may further include the back-gate insulator 13 and the back-gate electrode 14 as in the case of the first embodiment.

Fourth Embodiment

Figure 9:
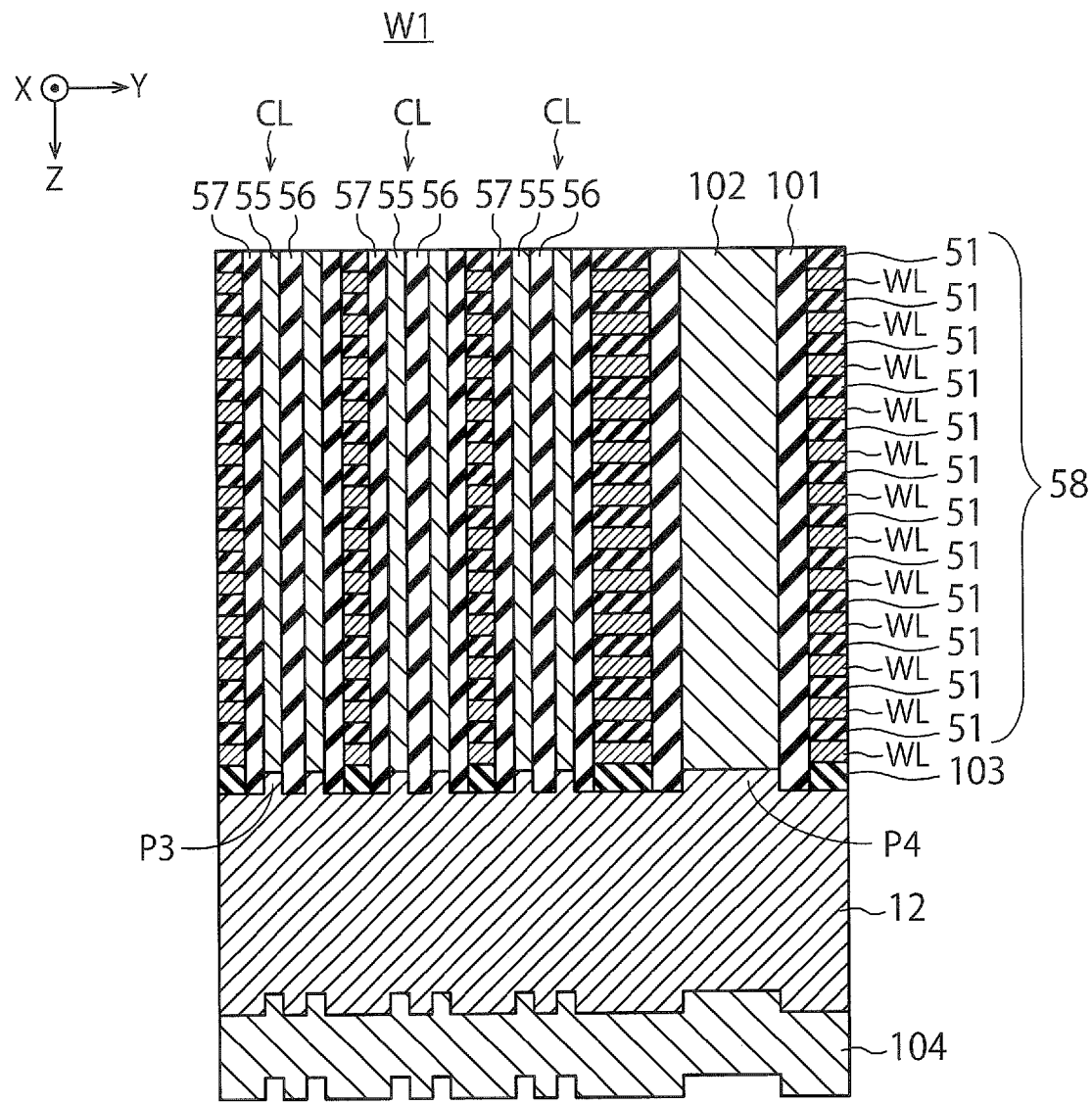
FIG. 9 is a cross-sectional view illustrating a structure of a semiconductor device of a fourth embodiment.

FIG. 9 is a cross-sectional view illustrating a structure of a semiconductor device of a fourth embodiment.

FIG. 9 of the present embodiment corresponds to FIG. 8 of the third embodiment. The channel semiconductor layers 55 and the source interconnection layer 102 of the present embodiment are not projected from the stacked film 58 into the semiconductor layer 12 as in the case of the third embodiment. That is, there is no projected portion P1 or P2. However, the surfaces (bottom faces) of the channel semiconductor layers 55 and the source interconnection layer 102 of the present embodiment are recessed with respect to the surface (bottom face) of the etch stopper insulator 103. Reference signs P3 and P4 indicate projected portions of the semiconductor layer 12 projected into the channel semiconductor layers 55 and the source interconnection layer 102, respectively. Such a structure is generated as dishing caused by CMP or over-etching caused by wet etching performed when removing the substrate 20.

The semiconductor layer 12 includes a first surface on the channel semiconductor layers 55 and the source interconnection layer 102 side, and a second surface on the opposite side of the channel semiconductor layers 55 and the source interconnection layer 102. In FIG. 9, the first surface is the surface of the semiconductor layer 12 in the −Z direction, and the second surface is the surface of the semiconductor layer 12 in the +Z direction.

The first surface and the second surface of the present embodiment have unevenness due to the influence of the projected portions P3 and P4. Specifically, the first surface and the second surface of the present embodiment are uneven faces having unevenness over regions in the +Z direction of the semiconductor layers 55 and a region in the +Z direction of the source interconnection layer 102. The thickness of the semiconductor layer 12 in those regions is also about uniform. The contents described above also apply to the metal layer 104, and also apply to a case where another layer instead of the metal layer 104 is formed on the surface of the semiconductor layer 12.

It is considered that unevenness on the second surface is eased as the semiconductor layer 12 becomes thicker. That is, as the semiconductor layer 12 becomes thicker, the shape of the second surface becomes closer to a flat shape. When unevenness of the second surface of the semiconductor layer 12 is eased, unevenness on both surfaces of the metal layer 104 is to be eased as well.

With the present embodiment, it is possible to reduce variation in the cell currents of the plurality of columnar portions CL through removing the projected portions P1 and P2 as in the case of the third embodiment.

The semiconductor device of the present embodiment may further include the back-gate insulator 13 and the back-gate electrode 14 as in the case of the first embodiment.

Modification of Second to Fourth Embodiments

Figure 10:
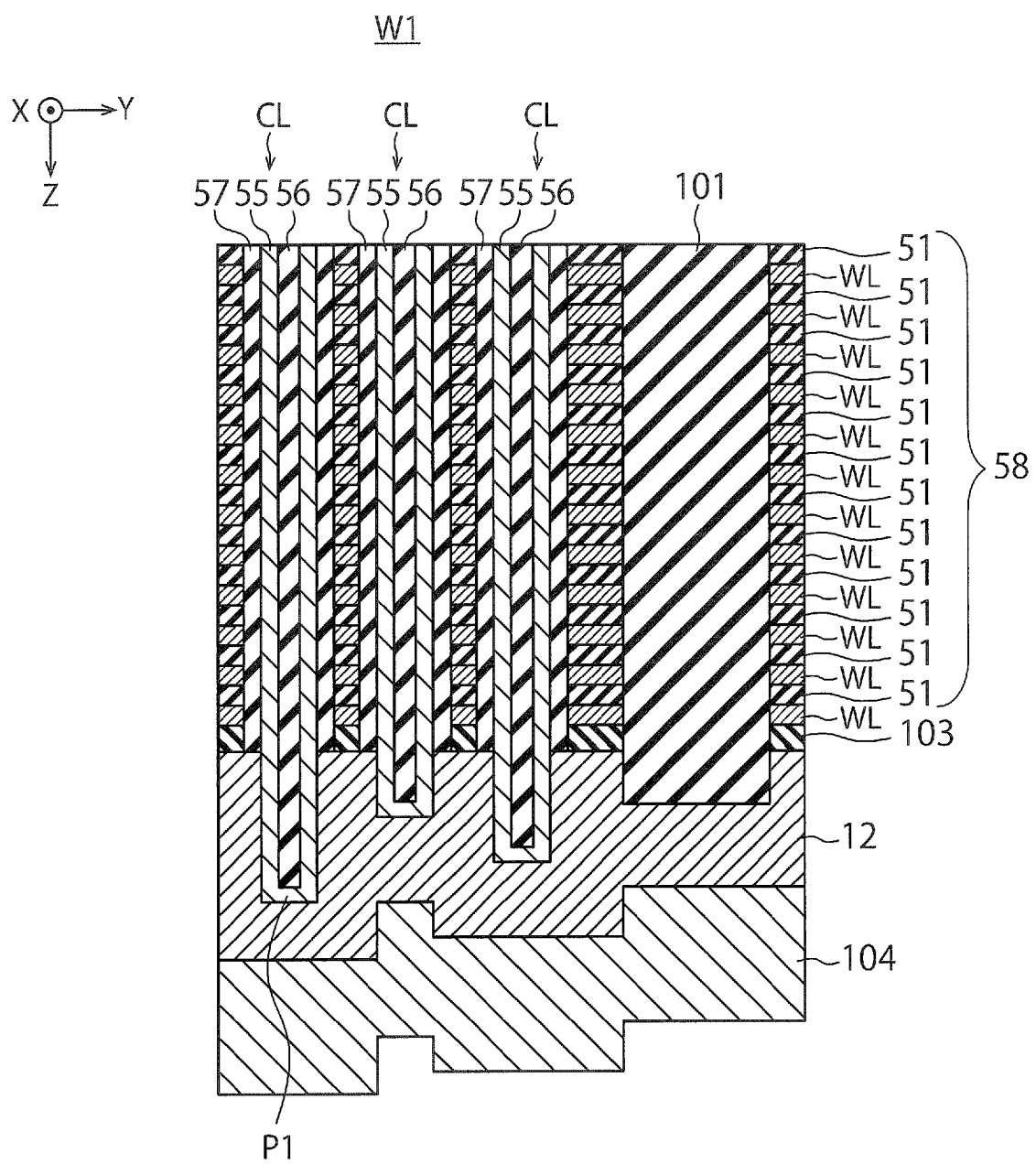
FIG. 10 is a cross-sectional view illustrating a structure of a semiconductor device of a modification of the second to fourth embodiments.

FIG. 10 is a cross-sectional view illustrating a structure of a semiconductor device of a modification of the second to fourth embodiments.

The structure illustrated in FIG. 10 is similarly to the structure illustrated in FIG. 7. However, the source insulator 101 and the source interconnection layer 102 in FIG. 7 are replaced with the source insulator 101 in FIG. 10.

Figure 11:
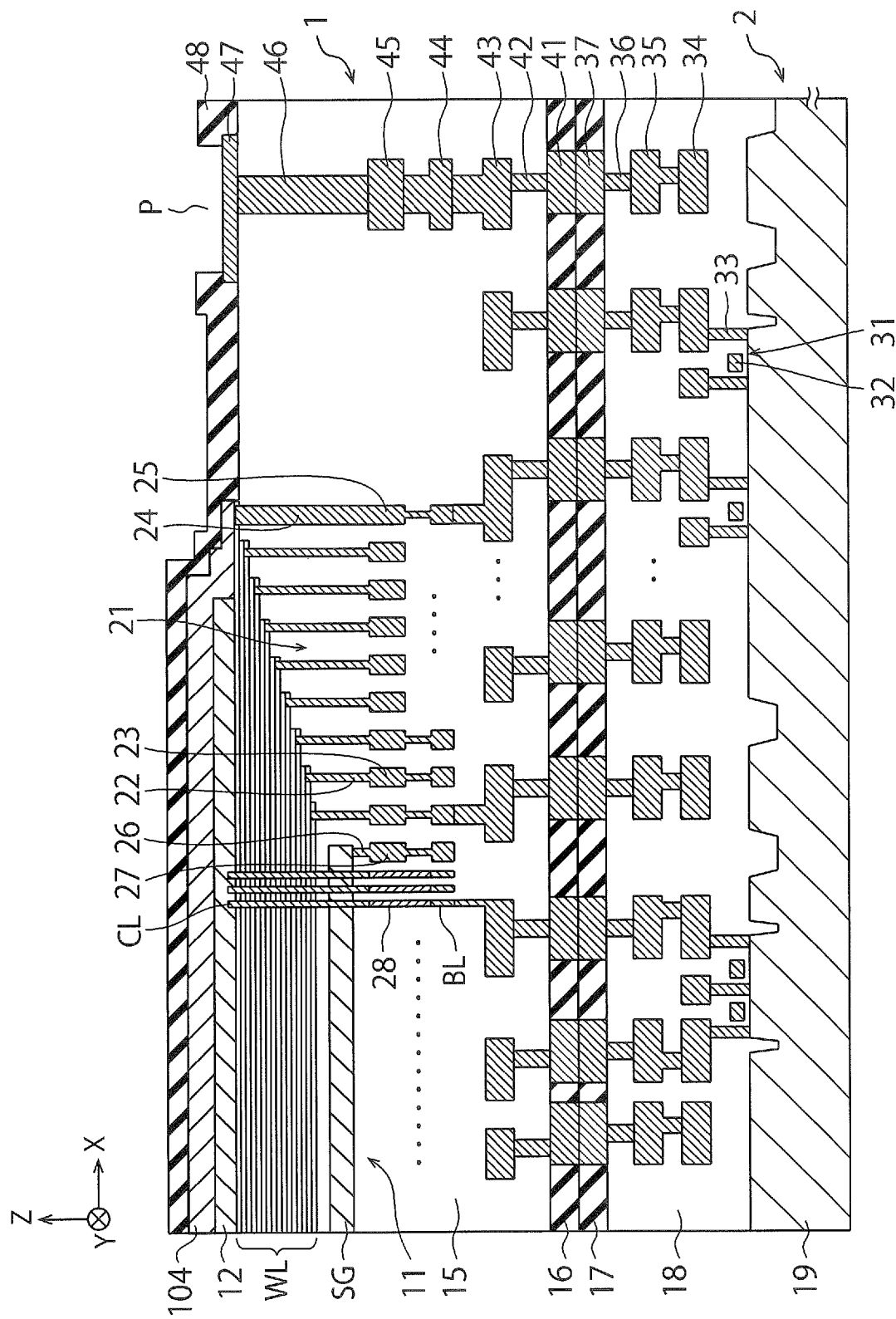
FIG. 11 is a cross-sectional view illustrating the structure of the semiconductor device of the modification of the second to fourth embodiment.

FIG. 11 is a cross-sectional view illustrating the structure of the semiconductor device of the modification of the second to fourth embodiment.

The structure illustrated in FIG. 11 is similarly to the structure illustrated in FIG. 1. However, the back-gate insulator 13 and the back-gate electrode 14 in FIG. 1 are replaced with the metal layer 104 in FIG. 11. In FIG. 11, the metal layer 104 is formed on the semiconductor layer 12 similarly to that in FIG. 10, and electrically connected to a source line control circuit (unshown) in the circuit chip 2 via the contact plug 24 and the interconnection layer 25.

According to the present modification, effects as similar to those in the second to fourth embodiments can be realized without the source interconnection layer 102.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first film including a plurality of electrode layers and a plurality of insulating layers provided alternately in a first direction;
   a first semiconductor layer provided in the first film via a charge storage layer and extending in the first direction;
   a first conductive member provided in the first film and extending in the first direction; and
   a second semiconductor layer provided on the first film to contact the first semiconductor layer,
   wherein
   the second semiconductor layer includes a first surface on a side of the first film, and a second surface on an opposite side of the first surface, and
   the second surface is an uneven face protruding towards the first direction.

2. The device of claim 1, further comprising a first insulator provided on a surface of the second semiconductor layer.

3. The device of claim 2, further comprising a first electrode provided on a surface of the first insulator.

4. The device of claim 3, further comprising a second conductive member provided outside the first film and extending in the first direction,
   wherein the first electrode is provided on the surface of the first insulator to contact the second conductive member.

5. The device of claim 1, wherein the second semiconductor layer is an n-type semiconductor layer.

6. The device of claim 1, wherein the second semiconductor layer is a p-type semiconductor layer.

7. The device of claim 1, wherein the second semiconductor layer is provided on a surface of the first film via a high-dielectric insulator.

8. The device of claim 7, wherein the high-dielectric insulator includes a rare-earth element.

9. The device of claim 1, wherein
   the first semiconductor layer includes a first portion protruding towards the second surface,
   the first conductive member includes a second portion protruding towards the second surface, and
   the second semiconductor layer is provided to contact the first portion of the first semiconductor layer and the second portion of the first conductive member.

10. The device of claim 1, wherein the first surface does not protrude towards the second surface.

11. The device of claim 1, further comprising a first chip including a first pad, and a second chip including a second pad provided on the first pad, wherein the second chip comprises:
    the first film;
    the first semiconductor layer;
    the first conductive member;
    the second semiconductor layer;
    a first insulator provided on a surface of the second semiconductor layer; and
    a first electrode provided on a surface of the first insulator.

12. The device of claim 11, further comprising a second conductive member provided outside the first film and extending in the first direction, wherein the first electrode is provided on the surface of the first insulator to contact the second conductive member.

13. The device of claim 11, wherein the second semiconductor layer is provided on a surface of the first film via a high-dielectric insulator.

14. The device of claim 13, wherein the high-dielectric insulator includes a rare-earth element.

15. The device of claim 11, wherein
the first semiconductor layer includes a first portion protruding towards the second surface,
the first conductive member includes a second portion protruding towards the second surface, and
the second semiconductor layer is provided to contact the first portions of the first semiconductor layer and the second portion of the first conductive member.

16. A semiconductor device comprising:
a first film including a plurality of electrode layers and a plurality of insulating layers provided alternately in a first direction;
a first semiconductor layer provided in the first film via a charge storage layer and extending in the first direction;
a first conductive member provided in the first film, a longest dimension of the first conductive member extending in the first direction; and
a second semiconductor layer provided on the first film to contact the first semiconductor layer,
wherein
the second semiconductor layer includes a first surface on a side of the first film, and a second surface on an opposite side of the first surface, and
the first surface and the second surface are flat faces.

17. A semiconductor device comprising:
a first film including a plurality of electrode layers and a plurality of insulating layers provided alternately in a first direction;
a first semiconductor layer provided in the first film via a charge storage layer and extending in the first direction;
a first conductive member provided in the first film and extending in the first direction; and
a second semiconductor layer provided on the first film to contact the first semiconductor layer,
wherein
the second semiconductor layer includes a first surface on a side of the first film, and a second surface on an opposite side of the first surface, and
the second surface is an uneven face protruding towards the first direction.

* * * * *